(12) United States Patent
Murakita et al.

(10) Patent No.: US 11,659,659 B2
(45) Date of Patent: May 23, 2023

(54) CERAMIC ELECTRONIC COMPONENT (71) Applicant: Murata Manufacturing Co., Ltd., Kyoto (JP)

(72) Inventors: Naoya Murakita, Kyoto (JP); Yoshihito Otsubo, Kyoto (JP); Issei Yamamoto, Kyoto (JP); Yuta Morimoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/308,250

(22) Filed: May 5, 2021

(65) Prior Publication Data
US 2021/0259104 A1 Aug. 19, 2021

Related U.S. Application Data (63) Continuation of application No. PCT/JP2019/042775, filed on Oct. 31, 2019.

(30) Foreign Application Priority Data

Nov. 8, 2018 (JP) .............................. JP2018-210868

(51) Int. Cl.
*H05K 1/03* (2006.01)
*H05K 1/02* (2006.01)
*H05K 1/11* (2006.01)
(52) U.S. Cl.
CPC ......... *H05K 1/0306* (2013.01); *H05K 1/0298* (2013.01); *H05K 1/115* (2013.01);
(Continued)

(58) Field of Classification Search
CPC .... H05K 1/0306; H05K 1/0298; H05K 1/111; H05K 2201/099; H05K 2201/09909;
(Continued)

(56) References Cited

U.S. PATENT DOCUMENTS 4,164,778 A * 8/1979 Sawairi .................. H05K 1/111
361/779
5,386,087 A * 1/1995 Lee ....................... H05K 3/3452
174/261

(Continued)

FOREIGN PATENT DOCUMENTS

JP 2002171050 A 6/2002
JP 2005209881 A 8/2005

(Continued)

OTHER PUBLICATIONS

English Translation JP2005-209881 (Year: 2005).*

(Continued)

*Primary Examiner* — Steven T Sawyer
(74) *Attorney, Agent, or Firm* — Pearne & Gordon LLP (57) ABSTRACT

A ceramic electronic component of the present disclosure includes a component body including a ceramic layer, at least one terminal electrode provided on one main surface of the component body, and an insulating covering layer provided across the ceramic layer and the terminal electrode to cover part, instead of an entire circumference, of a peripheral edge portion of the terminal electrode, wherein when viewed in plan view from one main surface of the component body, the covering layer intersects with the terminal electrode at a non-perpendicular angle at an intersection of the covering layer and the terminal electrode not covered with the covering layer.

9 Claims, 4 Drawing Sheets (52) U.S. Cl.
CPC .............. *H05K 2201/099* (2013.01); *H05K 2201/09909* (2013.01); *H05K 2203/0597* (2013.01)

(58) Field of Classification Search
CPC ..... H05K 2201/09881; H05K 2203/05; H05K 2203/0597; H05K 3/0091; H05K 3/4007; H05K 3/1216; H05K 3/246; H05K 3/38; H05K 3/4629; H05K 2203/0278; H05K 2203/0545; H05K 2203/1476; H01L 23/15; H01L 21/4853; H01L 23/49811; H01L 23/49822; H01L 23/49827; H01L 2924/0002; Y10T 428/24488
See application file for complete search history.

(56) References Cited

U.S. PATENT DOCUMENTS

| | | | | |
|---|---|---|---|---|
| 5,731,066 | A * | 3/1998 | Ando | H01L 23/49811 |
| | | | | 257/E23.068 |
| 6,228,466 | B1 | 5/2001 | Tsukada et al. | |
| 6,324,754 | B1 * | 12/2001 | DiStefano | H01L 24/81 |
| | | | | 29/840 |
| 2004/0099936 | A1 * | 5/2004 | Caletka | H01L 23/3128 |
| | | | | 257/E23.079 |
| 2005/0098611 | A1 * | 5/2005 | Reiss | H05K 3/3452 |
| | | | | 228/180.21 |
| 2008/0093749 | A1 * | 4/2008 | Gerber | H05K 1/111 |
| | | | | 257/784 |
| 2014/0057080 | A1 * | 2/2014 | Iwakoshi | H01L 23/49811 |
| | | | | 428/157 |
| 2015/0173189 | A1 * | 6/2015 | Higuchi | H05K 3/3452 |
| | | | | 361/728 |
| 2016/0014892 | A1 * | 1/2016 | Nakamura | H05K 3/1291 |
| | | | | 174/258 |
| 2018/0063952 | A1 * | 3/2018 | Noguchi | H01L 23/562 |
| 2019/0244886 | A1 * | 8/2019 | Suzuki | H05K 3/285 |

FOREIGN PATENT DOCUMENTS

| | | |
|---|---|---|
| JP | 2018037576 A | 3/2018 |
| WO | 2012157436 A1 | 11/2012 |
| WO | 2014156393 A1 | 10/2014 |

OTHER PUBLICATIONS

International Search Report issued in Application No. PCT/JP2019/042775, dated Jan. 7, 2020.

Written Opinion issued in Application No. PCT/JP2019/042775, dated Jan. 7, 2020.

* cited by examiner

CERAMIC ELECTRONIC COMPONENT

CROSS REFERENCE TO RELATED APPLICATIONS

This is a continuation of International Application No. PCT/JP2019/042775 filed on Oct. 31, 2019 which claims priority from Japanese Patent Application No. 2018-210868 filed on Nov. 8, 2018. The contents of these applications are incorporated herein by reference in their entireties.

BACKGROUND OF THE DISCLOSURE

Field of the Disclosure

The present disclosure relates to a ceramic electronic component.

Description of the Related Art

As an example of ceramic electronic components mounted on a mounting board, Patent Document 1 discloses a ceramic electronic component including a component body and an external terminal electrode provided along the main surface of the component body where the external terminal electrode has a peripheral edge portion and a central portion surrounded by the peripheral edge portion, the thickness of the peripheral edge portion is thicker than the thickness of the central portion, and at least a part of the peripheral edge portion is embedded in the component body. Patent Document 1 describes that it is preferable that an electrically insulating covering layer be formed along the main surface of the component body so as to cover at least a part of the peripheral edge portion of the external terminal electrode.

Patent Document 1: WO 2012/157436 A

BRIEF SUMMARY OF THE DISCLOSURE

As described in Patent Document 1, the adhesion strength of the terminal electrode can be improved by covering the entire circumference or a part of the peripheral edge portion of the external terminal electrode (hereinafter, simply referred to as a terminal electrode) with a covering layer.

Figure 11:
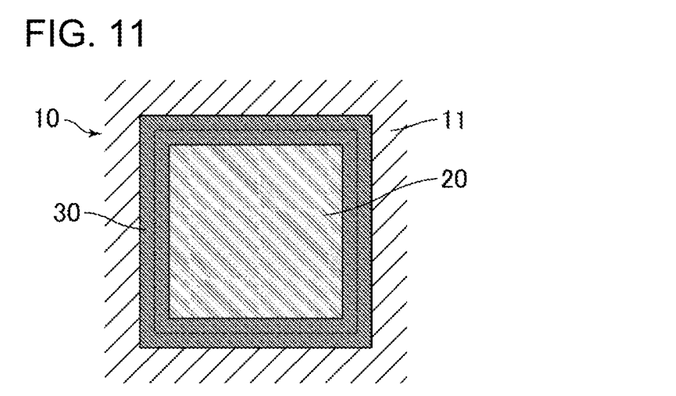
FIG. 11 is a plan view schematically showing an example of a conventional ceramic electronic component in which the entire circumference of the peripheral edge portion of the terminal electrode is covered with a covering layer.
Figure 12:
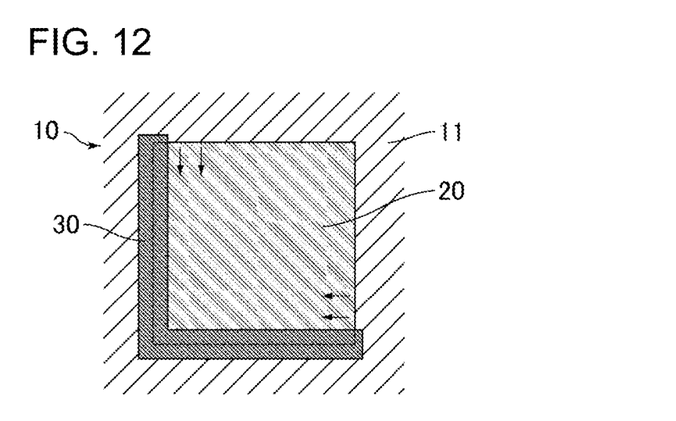
FIG. 12 is a plan view schematically showing an example of a conventional ceramic electronic component in which a part of the peripheral edge portion of the terminal electrode is covered with a covering layer.

FIG. 11 is a plan view schematically showing an example of a conventional ceramic electronic component in which the entire circumference of the peripheral edge portion of the terminal electrode is covered with a covering layer. FIG. 12 is a plan view schematically showing an example of a conventional ceramic electronic component in which a part of the peripheral edge portion of the terminal electrode is covered with a covering layer. The adhesion strength of a terminal electrode 20 to a component body 10 is increased when the entire circumference of the peripheral edge portion of the terminal electrode 20 is covered with a covering layer 30 as shown in FIG. 11, compared with when a part of the peripheral edge portion of the terminal electrode 20 is covered with the covering layer 30 as shown in FIG. 12.

However, since the area of the terminal electrode that can be formed on a component body having a predetermined size is limited, the exposed area of the terminal electrode is decreased when the entire circumference of the peripheral edge portion of the terminal electrode is covered with a covering layer, so that the high resistance or the like may cause the reduction of the electrical characteristics. Further, when the terminal electrode is formed near the end face of the component body, it is necessary to form the terminal electrode in consideration of the width of the covering layer, so that the distance between the end face of the component body and the terminal electrode cannot be reduced.

In order to solve the above problem, it is effective to cover a part of the peripheral edge portion of the terminal electrode with a covering layer instead of the entire circumference. However, the adhesion strength of the terminal electrode is decreased at the peripheral edge portion, of the terminal electrode, that is not covered with the covering layer.

Also, when a part of the peripheral edge portion of the terminal electrode is covered with a covering layer instead of the entire circumference, since stress is concentrated at the point where the terminal electrode and the covering layer overlap, for example, with respect to the terminal electrode that tends to contract in the direction of the arrow shown in FIG. 12, the terminal electrode is easily peeled off.

The present disclosure has been made to solve the above problem, and an object of the present disclosure is to provide a ceramic electronic component having a terminal electrode which is not easily be peeled off while a part of the peripheral edge portion of the terminal electrode is covered with a covering layer.

A ceramic electronic component of the present disclosure includes a component body including a ceramic layer, at least one terminal electrode provided on one main surface of the component body, and an insulating covering layer provided across the ceramic layer and the terminal electrode to cover part, instead of an entire circumference, of a peripheral edge portion of the terminal electrode, wherein when viewed in plan view from one main surface of the component body, the covering layer intersects with the terminal electrode at a non-perpendicular angle at an intersection of the covering layer and the terminal electrode not covered with the covering layer.

According to the present disclosure, it is possible to provide a ceramic electronic component in which the terminal electrode is not easily peeled off while a part of the peripheral edge portion of the terminal electrode is covered with a covering layer.

DETAILED DESCRIPTION OF THE DISCLOSURE

Hereinafter, the multilayer ceramic electronic component of the present disclosure will be described. The present disclosure is not limited to the following configurations, but can be applied by appropriately changing the configurations within a range not changing the gist of the present disclosure. Note that a combination of two or more individual desirable configurations described below is also included in the present disclosure.

The ceramic electronic component of the present disclosure is a ceramic electronic component that can be mounted on a mounting board. The present disclosure can be applied to various laminated ceramic electronic components such as multilayer ceramic board. However, the ceramic electronic component of the present disclosure is not limited to the laminated structure, and may be a single-layer structure.

Figure 1:
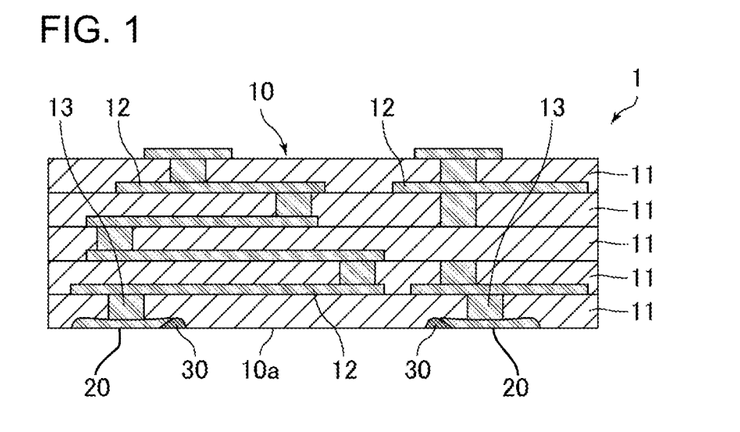
FIG. 1 is a sectional view schematically showing a ceramic electronic component according to an embodiment of the present disclosure.

FIG. 1 is a sectional view schematically showing a ceramic electronic component according to an embodiment of the present disclosure. A ceramic electronic component 1 shown in FIG. 1 is a laminated ceramic electronic component. The ceramic electronic component 1 includes a component body 10 including a plurality of laminated ceramic layers 11. Inside the component body 10, as an internal conductor, an inner conductor film 12 is provided along a specific interface between the ceramic layers 11, and a via conductor 13 is provided so as to penetrate the specific ceramic layer 11. However, the ceramic electronic component 1 is not limited to the laminated structure, and may be a single-layer structure. That is, the component body 10 may include a plurality of ceramic layers 11 or may include a single ceramic layer 11.

The ceramic electronic component 1 shown in FIG. 1 further includes a terminal electrode 20 provided on one main surface 10a of the component body 10. The ceramic electronic component 1 is mounted on a mounting board (not shown) while the terminal electrode 20 is electrically connected to and mechanically fixed to the mounting board.

Figure 2:
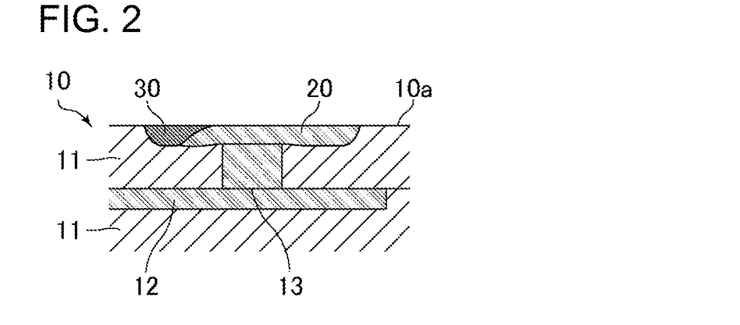
FIG. 2 is an example of an enlarged sectional view of the vicinity of the terminal electrode of the ceramic electronic component shown in FIG. 1.
Figure 3:
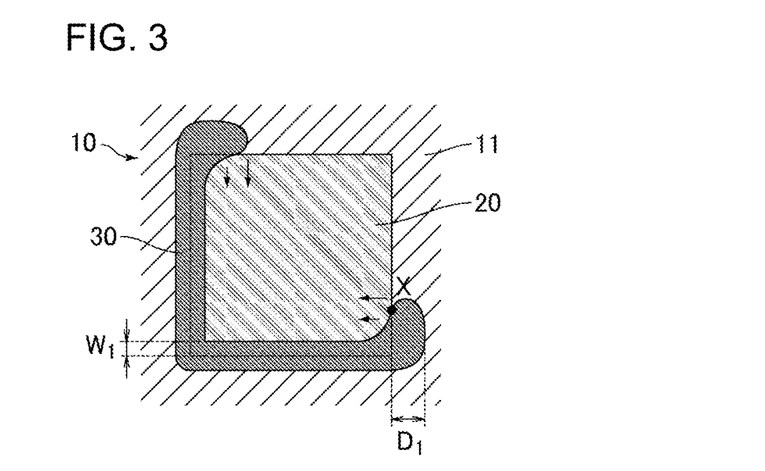
FIG. 3 is an example of an enlarged plan view of the vicinity of the terminal electrode of the ceramic electronic component shown in FIG. 1.

FIG. 2 is an example of an enlarged sectional view of the vicinity of the terminal electrode of the ceramic electronic component shown in FIG. 1. In FIG. 2, the terminal electrode 20 is shown upside down relative to that in FIG. 1. Further, FIG. 3 is an example of an enlarged plan view of the vicinity of the terminal electrode of the ceramic electronic component shown in FIG. 1. FIG. 3 shows a plan view when one main surface of the component body is viewed in plan view from the lamination direction.

As shown in FIGS. 2 and 3, in the ceramic electronic component 1 shown in FIG. 1, an insulating covering layer 30 is provided across the ceramic layer 11 and the terminal electrode 20 so as to cover part, instead of the entire circumference, of the peripheral edge portion of the terminal electrode 20.

The planar shape of the terminal electrode 20 is not particularly limited, but is preferably a square shape or a substantially rectangular shape as shown in FIG. 3. In FIG. 3, the covering layer 30 covers two sides of the terminal electrode 20, but may cover three sides or one side of the terminal electrode 20. Further, the covering layer 30 may cover halfway along the side of the terminal electrode 20.

Although not shown, it is preferable that a plating film be formed on the surface of the terminal electrode 20. In this case, the plating film is preferably formed so as to cover part of the covering layer 30 in addition to the entire terminal electrode 20.

In the present embodiment, as shown in FIG. 2, the terminal electrode 20 is embedded in the component body 10, and the surface of the terminal electrode 20 is flush with the one main surface 10a of the component body 10. Further, the covering layer 30 is also embedded in the component body 10, and the surface of the covering layer 30 is flush with the surface of the terminal electrode 20 and the one main surface 10a of the component body 10. However, the terminal electrode 20 and the covering layer 30 may not be embedded in the component body 10. Further, when the terminal electrode 20 and the covering layer 30 are embedded in the component body 10, the surface of the terminal electrode 20 and the surface of the covering layer 30 may not be flush with the one main surface 10a of the component body 10.

As shown in FIG. 3, the covering layer 30 intersects with the terminal electrode 20 at a non-perpendicular angle at the intersection at which the covering layer 30 and the terminal electrode 20 not covered with the covering layer 30 intersect (the portion indicated by point X in FIG. 3). That is, the covering layer 30 does not intersect with the terminal electrode 20 perpendicularly.

In this way, the ceramic electronic component of the present disclosure is characterized in that when viewed in plan view from one main surface of the component body, the covering layer intersects with the terminal electrode at a non-perpendicular angle at the intersection of the covering layer and the terminal electrode not covered with the covering layer.

Since the exposed area of the terminal electrode 20 can be increased when a part of the peripheral edge portion of the terminal electrode 20 is covered with the covering layer 30 as shown in FIG. 3, compared with when the entire circumference of the peripheral edge portion of the terminal electrode 20 is covered with the covering layer 30 as shown in FIG. 11, it is possible to suppress the deterioration of electrical characteristics. When the terminal electrode 20 is formed near the end face of the component body 10, the peripheral edge portion of the terminal electrode 20 near the end face of the component body 10 is not covered with the covering layer 30, so that the distance between the end face of the component body 10 and the terminal electrode 20 can be reduced.

Furthermore, unlike the case where the terminal electrode 20 is covered with the covering layer 30 so that the covering layer 30 intersects with the terminal electrode 20 perpendicularly as shown in FIG. 12, the terminal electrode 20 is covered with the covering layer 30 so that the covering layer 30 does not intersect with the terminal electrode 20 perpendicularly as shown in FIG. 3, so that the terminal electrode 20 cannot easily be peeled off. It is conceivable that one of the reasons is that unlike the case in FIG. 12, when the covering layers 30 toward the intersection X diagonally intersects with the terminal electrode 20 that is to be contracted in the direction of the arrow shown in FIG. 3, it is possible to suppress the stress concentration.

Figure 4:
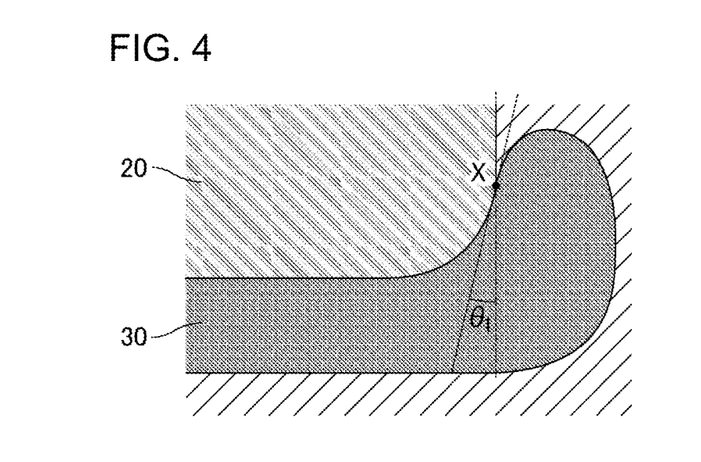
FIG. 4 is an enlarged view of the vicinity of the intersection shown in FIG. 3.

FIG. 4 is an enlarged view of the vicinity of the intersection shown in FIG. 3. In FIG. 4, the angle formed by the covering layer 30 and the terminal electrode 20 (the angle indicated by $\theta_1$ in FIG. 4) is an acute angle. That is, the covering layer 30 and the edge of the terminal electrode 20 covered with the covering layer 30 (the portion shown as an extension line of the terminal electrode 20 in FIG. 4) intersect at an acute angle. Therefore, the width of the covering layer 30 is wider toward the intersection X.

In the ceramic electronic component of the present disclosure, it is preferable that as shown in FIG. 4, the covering layer intersect with the terminal electrode so that the angle formed by the covering layer and the terminal electrode is an acute angle at the intersection of the terminal electrode not covered with the covering layer and the covering layer. In the structure shown in FIG. 12, the stress is likely to be concentrated at the intersection, whereas in the structures shown in FIGS. 3 and 4, the stress is not concentrated at the intersection and is easily dispersed.

When the covering layer has a curved shape as shown in FIG. 4, the angle formed by the covering layer and the terminal electrode means the angle formed by the tangent line of the covering layer and the edge of the terminal electrode covered with the covering layer.

In the ceramic electronic component of the present disclosure, when the angle $\theta_1$ formed by the covering layer and the terminal electrode is an acute angle, the angle $\theta_1$ is preferably 20° or more, and preferably 60° or less.

In the ceramic electronic component of the present disclosure, as shown in FIGS. 3 and 4, it is preferable that the covering layer 30 have a curved shape toward the intersection X. In this case, the stress applied to the intersection X can be more dispersed.

When the covering layer 30 has a curved shape toward the intersection X, it may have an upwardly convex curved shape or a downwardly convex curved shape. The top of the curved shape may be located outside or inside the terminal electrode 20. Further, it may have a curved shape having a plurality of curved portions.

Figure 5:
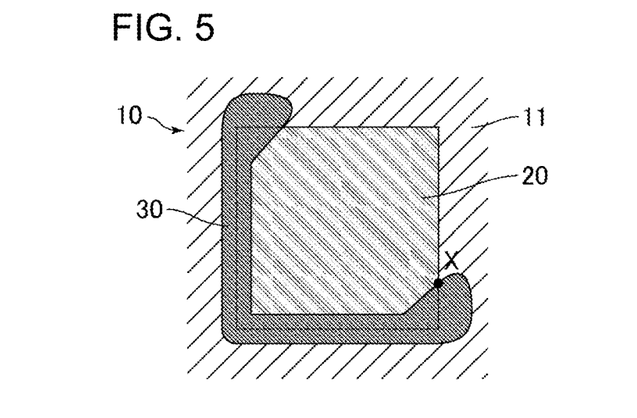
FIG. 5 is another example of an enlarged plan view of the vicinity of the terminal electrode of the ceramic electronic component shown in FIG. 1.

FIG. 5 is another example of an enlarged plan view of the vicinity of the terminal electrode of the ceramic electronic component shown in FIG. 1. As shown in FIG. 5, the covering layer 30 may have a linear shape toward the intersection X.

When the covering layer 30 has a linear shape toward the intersection X, it may have a linear shape having a plurality of curved portions.

In the ceramic electronic component of the present disclosure, it is preferable that as shown in FIGS. 3 and 5, when viewed in plan view from one main surface of the component body 10, the tip of the covering layer 30 protrude from the terminal electrode 20 and be provided on the surface of the ceramic layer 11. When the tip of the covering layer 30 protrudes from the terminal electrode 20, the area subjected to stress by the covering layer 30 increases, so that the stress can be dispersed.

When the tip of the covering layer 30 protrudes from the terminal electrode 20 and is provided on the surface of the ceramic layer 11, it is preferable that the tip of the covering layer 30 have a curved shape. In this case, the stress applied to the tip of the covering layer 30 can be more dispersed.

When the tip of the covering layer 30 has a curved shape, it is preferable that as shown in FIGS. 3 and 5, the tip have a curved shape that is convex upward with respect to the terminal electrode 20, but it may have a curved shape that is convex downward with respect to the terminal electrode 20. Further, it may have a curved shape having a plurality of curved portions.

Figure 6:
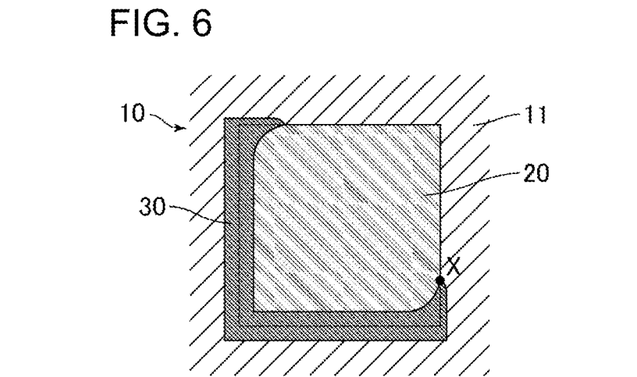
FIG. 6 is a plan view schematically showing another example of the covering layer whose tip protrudes from the terminal electrode.

FIG. 6 is a plan view schematically showing another example of the covering layer whose tip protrudes from the terminal electrode. As shown in FIG. 6, when the tip of the covering layer 30 protrudes from the terminal electrode 20 and is provided on the surface of the ceramic layer 11, the tip of the covering layer 30 may have a linear shape.

When the tip of the covering layer 30 has a linear shape, it may have a linear shape having a plurality of curved portions.

Figure 7:
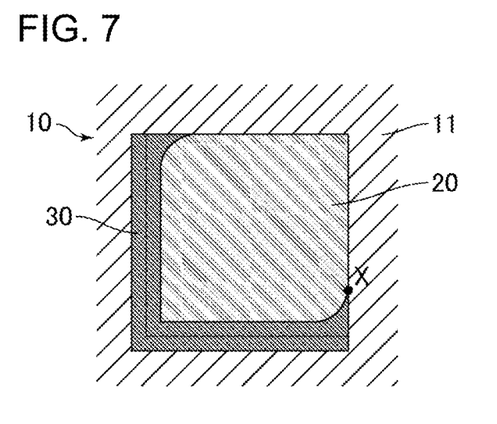
FIG. 7 is a plan view schematically showing an example of the covering layer whose tip does not protrude from the terminal electrode.

FIG. 7 is a plan view schematically showing an example of the covering layer whose tip does not protrude from the terminal electrode. As shown in FIG. 7, the tip end portion of the covering layer 30 may not protrude from the terminal electrode 20 and may be at the same position as the end face of the terminal electrode 20.

When the tip of the covering layer protrudes from the terminal electrode, it is preferable that the length of the covering layer protruding from the terminal electrode (length indicated by $D_1$ in FIG. 3) be longer than the width of the covering layer covering the terminal electrode (length indicated by $W_1$ in FIG. 3). As shown in FIG. 3, the width $W_1$ of the covering layer covering the terminal electrode is the length from the end of the covering layer 30 toward the terminal electrode 20 to the end of the terminal electrode 20.

The length $D_1$ of the covering layer protruding from the terminal electrode is not particularly limited, and may be, for example, 4 times or less or 2 times or less the width $W_1$ of the covering layer covering the terminal electrode. Further, the length $D_1$ of the covering layer protruding from the terminal electrode may be equal to or greater than the width $W_1$ of the covering layer covering the terminal electrode.

In the ceramic electronic component of the present disclosure, it is preferable that the relationship of $\alpha_3<\alpha_1<\alpha_2$ be established where the coefficient of linear expansion of the ceramic layer is $\alpha_1$, the coefficient of linear expansion of the terminal electrode is $\alpha_2$, and the coefficient of linear expansion of the covering layer is $\alpha_3$.

Figure 8:
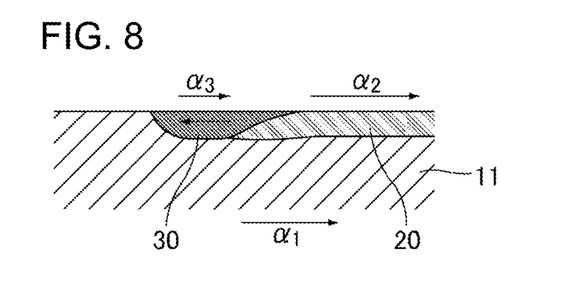
FIG. 8 is a sectional view for explaining the relationship between the linear expansion coefficients of the ceramic layer, the terminal electrode, and the covering layer.

FIG. 8 is a sectional view for explaining the relationship between the linear expansion coefficients of the ceramic layer, the terminal electrode, and the covering layer. In FIG. 8, the magnitude of the linear expansion coefficient is represented by the length of the arrow. Generally, the coefficient of linear expansion $\alpha_1$ of the ceramic layer 11 is smaller than the coefficient of linear expansion $\alpha_2$ of the terminal electrode 20. Therefore, when the terminal electrode 20 is contracted in the direction of the arrow shown in FIG. 8, the ceramic layer 11 around the terminal electrode 20 receives tensile stress. Therefore, by covering the terminal electrode 20 with the covering layer 30 having the smallest coefficient of linear expansion $\alpha_3$, a force that opposes the tensile stress due to the contraction of the terminal electrode 20 is generated as shown by the broken line arrow in FIG. 8. As a result, it is possible to suppress the stress concentration due to the contraction of the terminal electrode 20 and improve the strength.

The coefficient of linear expansion is obtained as the values measured by thermomechanical analysis (TMA) from room temperature to 500° C. at a heating rate of 5° C./rain.

Until this point, an embodiment is described in which the covering layer intersects with the terminal electrode so that the angle formed by the covering layer and the terminal electrode is an acute angle at the intersection of the terminal electrode not covered with the covering layer and the covering layer. However, the covering layer may intersect with the terminal electrode so that the angle formed by the covering layer and the terminal electrode is an obtuse angle at the intersection of the terminal electrode not covered with the covering layer and the covering layer.

Figure 9:
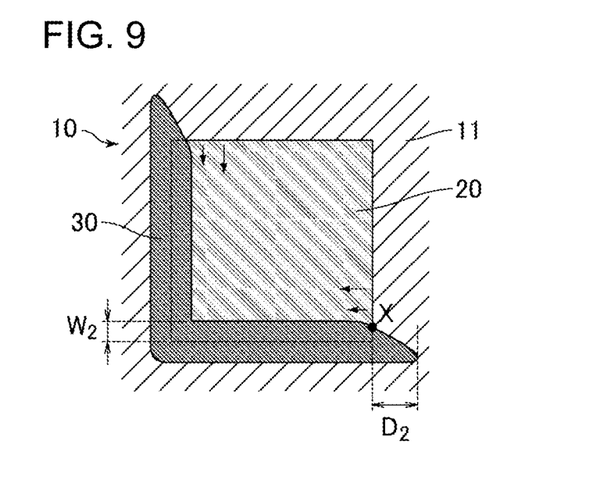
FIG. 9 is a plan view schematically showing an example of a covering layer intersecting the terminal electrode so that the angle formed by the covering layer and the terminal electrode is an obtuse angle.
Figure 10:
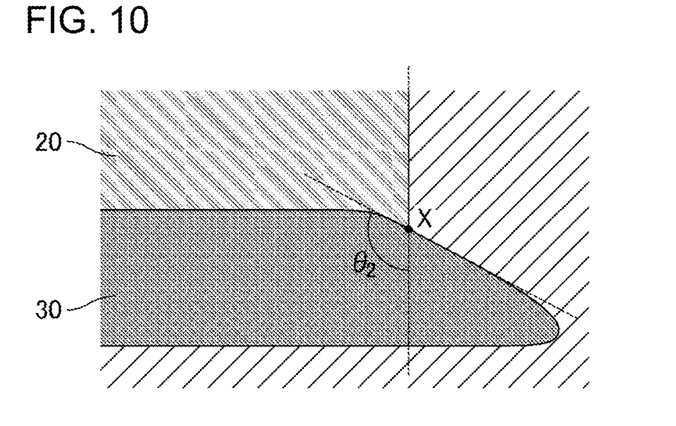
FIG. 10 is an enlarged view of the vicinity of the intersection shown in FIG. 9.

FIG. 9 is a plan view schematically showing an example of a covering layer intersecting the terminal electrode so that the angle formed by the covering layer and the terminal electrode is an obtuse angle. FIG. 10 is an enlarged view of the vicinity of the intersection shown in FIG. 9. As in FIGS. 3 and 4, in FIGS. 9 and 10, the insulating covering layer 30 is provided across the ceramic layer 11 and the terminal electrode 20 so as to cover part, instead of the entire circumference, of the peripheral edge portion of the terminal electrode 20. On the other hand, in FIGS. 9 and 10, the angle formed by the covering layer 30 and the terminal electrode 20 (the angle indicated by $\theta_2$ in FIG. 10) is an obtuse angle. That is, the covering layer 30 and the edge of the terminal electrode 20 covered with the covering layer 30 (the portion shown as an extension line of the terminal electrode 20 in FIG. 10) intersect at an obtuse angle. Therefore, the width of the covering layer 30 narrows toward the intersection X.

With the structures shown in FIGS. 9 and 10, the terminal electrode 20 cannot easily be peeled off as in the structures shown in FIGS. 3 and 4. It is conceivable that one of the reasons is that as in the case of FIG. 3, when the covering layers 30 toward the intersection X diagonally intersects with the terminal electrode 20 that is to be contracted in the direction of the arrow shown in FIG. 9, it is possible to suppress the stress concentration.

Further, in the structures shown in FIGS. 9 and 10, the exposed area of the terminal electrode 20 can be increased as compared with the structures shown in FIGS. 3 and 4. Therefore, the deterioration of the electrical characteristics can be further suppressed. Further, when the terminal electrode 20 is formed near the end face of the component body 10, the distance between the end face of the component body 10 and the terminal electrode 20 can be reduced as in the structure shown in FIGS. 3 and 4.

In the ceramic electronic component of the present disclosure, when the angle $\theta_2$ formed by the covering layer and the terminal electrode is an obtuse angle, the angle $\theta_2$ is preferably 120° or more, and preferably 160° or less.

As shown in FIGS. 9 and 10, it is preferable that the covering layer 30 have a curved shape toward the intersection X. In this case, it may have an upwardly convex curved shape or a downwardly convex curved shape. The top of the curved shape may be located outside or inside the terminal electrode 20. Further, it may have a curved shape having a plurality of curved portions.

Alternatively, the covering layer 30 may have a linear shape toward the intersection X. In this case, it may have a linear shape having a plurality of curved portions.

As shown in FIGS. 9 and 10, when viewed in plan view from one main surface of the component body 10, it is preferable that the tip of the covering layer 30 protrude from the terminal electrode 20 and be provided on the surface of the ceramic layer 11. In this case, it is preferable that the tip of the covering layer 30 have a curved shape.

When the tip of the covering layer 30 has a curved shape, it is preferable that as shown in FIGS. 9, the tip have a curved shape that is convex upward with respect to the terminal electrode 20, but it may have a curved shape that is convex downward with respect to the terminal electrode 20. Further, it may have a curved shape having a plurality of curved portions.

Alternatively, when the tip of the covering layer 30 protrudes from the terminal electrode 20 and is provided on the surface of the ceramic layer 11, the tip of the covering layer 30 may have a linear shape. When the tip of the covering layer 30 has a linear shape, it may have a linear shape having a plurality of curved portions. Further, the tip end portion of the covering layer 30 may not protrude from the terminal electrode 20 and may be at the same position as the end face of the terminal electrode 20.

When the tip of the covering layer protrudes from the terminal electrode, it is preferable that the length of the covering layer protruding from the terminal electrode (length indicated by $D_2$ in FIG. 9) be longer than the width of the covering layer covering the terminal electrode (length indicated by $W_2$ in FIG. 9). As shown in FIG. 9, the width $W_2$ of the covering layer covering the terminal electrode is the length from the end of the covering layer 30 toward the terminal electrode 20 to the end of the terminal electrode 20.

The length $D_2$ of the covering layer protruding from the terminal electrode is not particularly limited, and may be, for example, 4 times or less or 2 times or less the width $W_2$ of the covering layer covering the terminal electrode. Further, the length $D_2$ of the covering layer protruding from the terminal electrode may be equal to or greater than the width $W_2$ of the covering layer covering the terminal electrode.

When the angle formed by the covering layer and the terminal electrode is an obtuse angle, it is also preferable that the relationship of $\alpha_3 < \alpha_1 < \alpha_2$ be established where the coefficient of linear expansion of the ceramic layer is $\alpha 1$, the coefficient of linear expansion of the terminal electrode is $\alpha 2$, and the coefficient of linear expansion of the covering layer is $\alpha 3$.

The ceramic electronic component of the present disclosure is preferably manufactured as follows. Hereinafter, an example of a method of manufacturing the ceramic electronic component 1 shown in FIG. 1 will be described.

First, a plurality of ceramic green sheets to be the plurality of ceramic layers 11 is prepared. The ceramic green sheet is formed, for example, by applying the doctor blade method or the like to the ceramic slurry on the carrier film.

The thickness of the ceramic green sheet is, for example, 5 μm or more and 100 μm or less.

The ceramic slurry includes, for example, a ceramic powder, a binder, a plasticizer and the like. An example of the ceramic material contained in the ceramic green sheet may include a low-temperature sintered ceramic (LTCC) material. The low-temperature sintered ceramic material is a ceramic material that can be sintered at a temperature of 1000° C. or lower and can be simultaneously fired with Au, Ag, Cu, and the like having a small resistivity. Examples of the low-temperature sintered ceramic material include, specifically, a glass composite low-temperature sintered ceramic material made by mixing borosilicate glass with ceramic powders such as alumina, zirconia, magnesia, and forsterite, a crystallized glass-based low-temperature sintered ceramic material including $ZnO$—$MgO$—$Al_2O_3$—$SiO_2$-based crystallized glass, a non-glass low-temperature sintered ceramic materials including $BaO$—$Al_2O_3$—$SiO_2$ ceramic powder and $Al_2O_3$—$CaO$—$SiO_2$—$MgO$—$B_2O_3$ ceramic powder.

The inner conductor film 12 and the via conductor 13 are formed on a specific ceramic green sheet using a conductive paste. The inner conductor film 12 is formed, for example, by printing a conductive paste using a method such as screen printing. The via conductor 13 is formed by, for example, irradiating a ceramic green sheet with a laser beam or applying a mechanical punch to provide a through hole, and filling the through hole with a conductive paste.

The conductive paste includes, for example, a conductive metal powder, a binder, a plasticizer, and the like. A co-based material (ceramic powder) for adjusting the shrinkage rate may be added to the conductive paste. Examples of the conductive metal material contained in the conductive paste include a metal or the like containing at least one of Ag, Ag—Pt alloy, Ag—Pd alloy, Cu, Ni, Pt, Pd, W, Mo and Au as a main component. Among these conductive metal materials, Ag, Ag—Pt alloy, Ag—Pd alloy and Cu have low resistivity, and therefore can be more preferably used especially in a conductor pattern for high-frequency.

In addition, as a constituent material of the covering layer 30, the mixed raw material powder obtained by adding and mixing an appropriate amount of alumina ($Al_2O_3$) powder to the ceramic powder for the ceramic layer 11 described above, is dispersed and kneaded in an organic vehicle to prepare a ceramic paste for the covering layer.

The organic vehicle is a mixture of a binder and a solvent, and the types of the binder and the solvent and their blending ratios are not particularly limited. Examples of the organic vehicle may include alcohol such as terpineol, isopropylene alcohol, butyl carbitol, or butyl carbitol acetate in which an acrylic resin, an alkyd resin, a butyral resin, an ethyl cellulose, or the like is dissolved. In addition, various dispersants, plasticizers, and activators may be added as needed.

The coefficient of linear expansion of the covering layer can be adjusted by adjusting the amount of alumina powder added when producing a ceramic paste for the covering layer. As a result, it is preferable that the relationship of $\alpha_3 < \alpha_1 < \alpha_2$ be established where the coefficient of linear expansion of the ceramic layer is $\alpha_1$, the coefficient of linear expansion of the terminal electrode is $\alpha_2$, and the coefficient of linear expansion of the covering layer is $\alpha_3$. For example, it is preferable that the coefficient of linear expansion of the ceramic layer $\alpha_1$ be 10 ppm/° C., the coefficient of linear expansion of the terminal electrode $\alpha_2$ be 16 ppm/° C., and the coefficient of linear expansion of the covering layer $\alpha_3$ be 9 ppm/° C.

The terminal electrode 20 is formed in the ceramic green sheet disposed on one main surface after laminating by using the above-mentioned conductive paste. The terminal electrode 20 is formed, for example, by printing a conductive paste using a method such as screen printing.

The thickness of the terminal electrode 20 after printing is, for example, 10 μm or more and 20 μm or less.

After that, the ceramic paste for the covering layer is printed so as to cover part, instead of the entire circumference, of the peripheral edge portion of the terminal electrode 20 by a method such as screen printing. For example, printing is performed using a screen plate on which the covering layer 30 having the shape shown in FIG. 3 is formed.

The thickness of the covering layer 30 after printing is, for example, 20 μm or more and 30 μm or less. The amount of overlap between the covering layer 30 and the terminal electrode 20 is, for example, 30 μm or more and 200 μm or less.

The step of printing the ceramic paste for the covering layer may be carried out on the ceramic green sheet as described above, or may be carried out before the firing step is started after the laminating step described later is completed.

An unfired component body 10 is produced by laminating and pressure bonding a plurality of ceramic green sheets in a predetermined order.

The obtained unfired component body 10 is fired to obtain the sintered component body 10. Here, the inner conductor film 12, the via conductor 13, and the terminal electrode 20 are also sintered.

When necessary, a plating step is carried out to form a plating film on the terminal electrode 20. As a result, the ceramic electronic component 1 shown in FIG. 1 is obtained.

In the ceramic electronic component 1 shown in FIG. 1, for example, a surface mount component such as an IC chip or a passive element is mounted on the upper face of the component body 10 (the main surface opposite to the one main surface 10a), and a metal cover is attached to the component body 10 so as to cover the surface mount component.

When the above-mentioned step is performed in the state of a mother electronic component in which it is possible to produce the plurality of ceramic electronic components 1, the step of dividing the mother electronic component to produce each ceramic electronic component 1 is further performed.

The ceramic electronic component of the present disclosure is not limited to the above embodiments, and various applications and modifications may be made within the scope of the present disclosure with regard to the configuration, manufacturing conditions, and the like of the ceramic electronic component.

In the ceramic electronic component of the present disclosure, it is preferable that the covering layer do not intersect with the terminal electrode perpendicularly at all intersections of the intersections of the terminal electrode not covered with the covering layer and the covering layer, but the covering layer may not intersect with the terminal electrode perpendicularly at at least one intersection.

The planar shape of the tip of the covering layer may be the same or different. For example, while the covering layer intersects with the terminal electrode so that the angle formed by the covering layer and the terminal electrode is an acute angle at one intersection, the covering layer may intersect with the terminal electrode so that the angle formed by the covering layer and the terminal electrode is an obtuse angle at another intersection.

1: Ceramic electronic component
10: Component body
10a: One main surface of component body
11: Ceramic layer
12: Inner conductor film
13: Via conductor
20: Terminal electrode
30: Covering layer
$D_1$, $D_2$, Length of covering layer protruding from terminal electrode
$W_1$, $W_2$, Width of covering layer covering terminal electrode
X: Intersection of terminal electrode not covered with covering layer and covering layer
$\theta_1$, $\theta_2$: Angle formed by covering layer and terminal electrode

The invention claimed is:

1. A ceramic electronic component comprising: a component body including a ceramic layer;
at least one terminal electrode provided on one main surface of the component body;
and at least one insulating covering layer each provided across the ceramic layer and the at least one terminal electrode to separately cover a part, instead of an entire circumference, of a peripheral edge portion of each one of the at least one terminal electrode, wherein when viewed in plan view from one main surface of the component body, each one of the at least one insulating covering layer intersects with each one of the at least one terminal electrode at a non-perpendicular angle at least two intersections of the insulating covering layer and the terminal electrode not covered with the insulating covering layer, wherein a bottom surface of the insulating covering layer is tapered toward a top surface of the terminal electrode, and wherein when viewed in plan view from one main surface of the component body, a tip of the insulating covering layer outside of an intersection at which the insulating covering layer and the terminal electrode intersect protrudes from the terminal electrode and is provided on a surface of the ceramic layer, wherein the tip of the insulating covering layer has a curved shape.

2. The ceramic electronic component according to claim 1, wherein when viewed in plan view from one main surface of the component body, the insulating covering layer intersects with the terminal electrode so that an angle between the insulating covering layer and the terminal electrode is an acute angle at the intersection.

3. The ceramic electronic component according to claim 1, wherein a relationship of $\alpha_3 < \alpha_1 < \alpha_2$ is established where a coefficient of linear expansion of the ceramic layer is $\alpha_1$, a coefficient of linear expansion of the terminal electrode is $\alpha_2$, and a coefficient of linear expansion of the insulating covering layer is $\alpha_3$.

4. The ceramic electronic component according to claim 1, wherein when viewed in plan view from one main surface of the component body, the insulating covering layer intersects with the terminal electrode so that an angle between the insulating covering layer and the terminal electrode is an obtuse angle at the intersection.

5. The ceramic electronic component according to claim 2, wherein the insulating covering layer has a curved shape toward the intersection.

6. The ceramic electronic component according to claim 2, wherein when viewed in plan view from one main surface of the component body, a tip of the insulating covering layer protrudes from the terminal electrode and is provided on a surface of the ceramic layer.

7. The ceramic electronic component according to claim 2, wherein a relationship of $\alpha_3 < \alpha_1 < \alpha_2$ is established where a coefficient of linear expansion of the ceramic layer is $\alpha_1$, a coefficient of linear expansion of the terminal electrode is $\alpha_2$, and a coefficient of linear expansion of the insulating covering layer is $\alpha_3$.

8. The ceramic electronic component according to claim 5, wherein when viewed in plan view from one main surface of the component body, a tip of the insulating covering layer protrudes from the terminal electrode and is provided on a surface of the ceramic layer.

9. The ceramic electronic component according to claim 5, wherein a relationship of $\alpha_3 < \alpha_1 < \alpha_2$ is established where a coefficient of linear expansion of the ceramic layer is $\alpha_1$, a coefficient of linear expansion of the terminal electrode is $\alpha_2$, and a coefficient of linear expansion of the insulating covering layer is $\alpha_3$.

* * * * *

UNITED STATES PATENT AND TRADEMARK OFFICE
CERTIFICATE OF CORRECTION

PATENT NO. : 11,659,659 B2
APPLICATION NO. : 17/308250
DATED : May 23, 2023
INVENTOR(S) : Naoya Murakita et al.

It is certified that error appears in the above-identified patent and that said Letters Patent is hereby corrected as shown below:

In the Specification

Column 6, Line 64, "C./rain." should be -- C/min. --.

Signed and Sealed this
Thirtieth Day of January, 2024

Katherine Kelly Vidal
*Director of the United States Patent and Trademark Office*